United States Patent [19]

Ushiki et al.

[11] Patent Number: 5,220,997

[45] Date of Patent: Jun. 22, 1993

[54] PUSHING MECHANISM IN A LEAD FRAME CONVEYING APPARATUS

[75] Inventors: Hiroshi Ushiki; Kenji Kitakubo, both of Saitama, Japan

[73] Assignee: Kabushiki Kaisha Shinkawa, Tokyo, Japan

[21] Appl. No.: 927,618

[22] Filed: Aug. 7, 1992

[30] Foreign Application Priority Data

Aug. 8, 1991 [JP] Japan .................. 3-223446

[51] Int. Cl.[5] .................................. B65G 47/52
[52] U.S. Cl. .................. 198/468.1; 198/746; 414/19; 414/222
[58] Field of Search .............. 414/18, 19, 222, 749, 414/750

[56] References Cited

U.S. PATENT DOCUMENTS 4,065,003  12/1977  Hostettler ............... 414/222 X
4,405,277  9/1983   Burkner et al. .......... 414/222
4,744,460  5/1988   Pazzaglia ............... 198/468.1 X
4,759,681  7/1988   Nogami ................. 414/222 X

FOREIGN PATENT DOCUMENTS 1387387  3/1975  United Kingdom ........... 414/464.2

Primary Examiner—Michael S. Huppert
Assistant Examiner—Donald W. Underwood
Attorney, Agent, or Firm—Koda and Androlia

[57] ABSTRACT

In a lead frame conveying device for bringing lead frames into a storage magazine, a pusher claw is swingably mounted to a claw mover. When a lead frame is brought into the magazine, the claw mover moves towards the magazine, and this releases an engagement of the pusher claw with a stopper; as a result, the pusher claw swings down (by its own weight) so that the tip end of the push claw comes into contact with the trailing edge of the lead frame so that the pusher claw pushes the lead frame completely into the magazine.

1 Claim, 2 Drawing Sheets

PUSHING MECHANISM IN A LEAD FRAME CONVEYING APPARATUS

BACKGROUND OF THE INVENTION

1. Field of the Invention

The present invention relates to a lead frame conveying apparatus and more particularly to a lead frame pushing mechanism which pushes lead frames into a storage magazine after a bonding has been done on the lead frames in, for example, wire bonding, die bonding, etc.

2. Prior Art

When lead frames are transferred by a conveyor to store them in a magazine, it is necessary to make sure that each lead frame is completely inside the magazine. Two types of devices are presently used to bring each lead frame into the magazine.

One type uses a storage magazine that is of a special structure, and a conveyor extends into this special storage magazine. Another type uses an ordinary shape storage magazine near the end of conveyor. In this device, the efficiency of the lead frames pushed into the storage magazine depends upon the relationship between the conveying force (or a propelling force) of the conveyor and the friction between the magazine and the lead frames. In order to obtain good entry efficiency of the lead frames, a pinch roller is used. The pinch roller which pushes each lead frame on the surface of the conveyor is installed near the end of the conveyor. The conveying or propelling force of the conveyor is, as a result, utilized to its maximum extent possible.

In the case of the device of first type as described above, the storage magazine of a special structure is used; accordingly, it lacks versatility. As a result, the device of the second type is generally used.

In the second type, there is a gap between the end of the conveyor and the storage magazine. Accordingly, unless the inertia of the lead frame created by the propelling force of the conveyor is utilized fully, the lead frame is not completely put in the storage magazine.

As described above, how smoothly the lead frames are pushed into the storage magazine depends on the relationship between the conveying force (propelling force) of the conveyor and the friction between the magazine and the lead frame, and it often occurs that the lead frames are not orderly stored in the magazine. In addition, the speed of the conveyor needs to be high in order to pass each lead frame across the gap. If, however, the speed of the conveyor is too high and the inertia of the lead frames is too strong, the lead frames can pass through the storage magazine and fly out on the opposite side. Accordingly, in order to avoid such flying out, a stopper is required. However, if a stopper is used, damage may occur when the lead frame hits the stopper. In other words, wires bonded to a lead frame may be removed or bent when the lead frame hits the stopper.

SUMMARY OF THE INVENTION

Accordingly, the object of the present invention is to provide a lead frame conveying apparatus which requires a storage magazine of no special structure, uses a slow speed conveyor, and brings the lead frame into the storage magazine without relying upon uncertain factors such as the inertial force, etc.

The object of the present invention is accomplished by a unique structure used in a lead frame conveying apparatus which includes a conveyor that conveys lead frames and a storage magazine that stores the lead frames conveyed by the conveyor, and the unique structure of the present invention is that (i) a claw holder is installed above the end of the conveyor, the holder being movable in the direction parallel to the direction the lead frames are conveyed, (ii) a driving means drives the claw holder in a reciprocating motion after each lead frame has been entered into the storage magazine by the conveyor, (iii) a push claw installed rotatably on the claw holder has a pushing surface that pushes each lead frame into the magazine, (iv) a rotation-regulator is installed on the claw holder so that it restricts the rotation of the push claw in the direction opposite to the conveying direction of the lead frames, and (v) a stopper keeps the push claw above the conveying surface of the conveyor when the claw holder moves in the direction opposite to the conveying direction of the lead frames.

With the structure described above, when a lead frame is being conveyed by the conveyor, the push claw is kept lifted so that the claw does not obstruct the conveying of the lead frames. After the lead frame is brought into the storage magazine by the conveyor, the claw holder is caused to complete its reciprocating motion by the driving means. As a result of the advancing motion, the push claw is first moved away (and separated) from the stopper and rotates down so that the lower end of the push claw comes below the conveying surface of the conveyor. Afterward, the push claw comes into contact with the trailing end of the lead frame and pushes the lead frame completely into the storage magazine. Then, the claw holder completes its return motion so that the push claw is moved back to contact the stopper and is pushed up.

Thus, after the lead frame has been brought into the storage magazine by the conveyor, the push claw is actuated so as to push the lead frame completely into the storage magazine. In other words, the present invention does not rely on uncertain factors such as the inertial force, etc. as conventional devices do; instead, in the present invention, when pushing the lead frames into the magazine, the lead frames are completely pushed to fixed positions inside the storage magazine. In addition, a slow conveyor speed may be used; therefore, no damage occurs to the wires bonded to the lead frames. Moreover, since there is no need for a storage magazine to be of a special structure, the present invention is superior in terms of versatility.

DETAILED DESCRIPTION OF THE INVENTION

Figure 1:
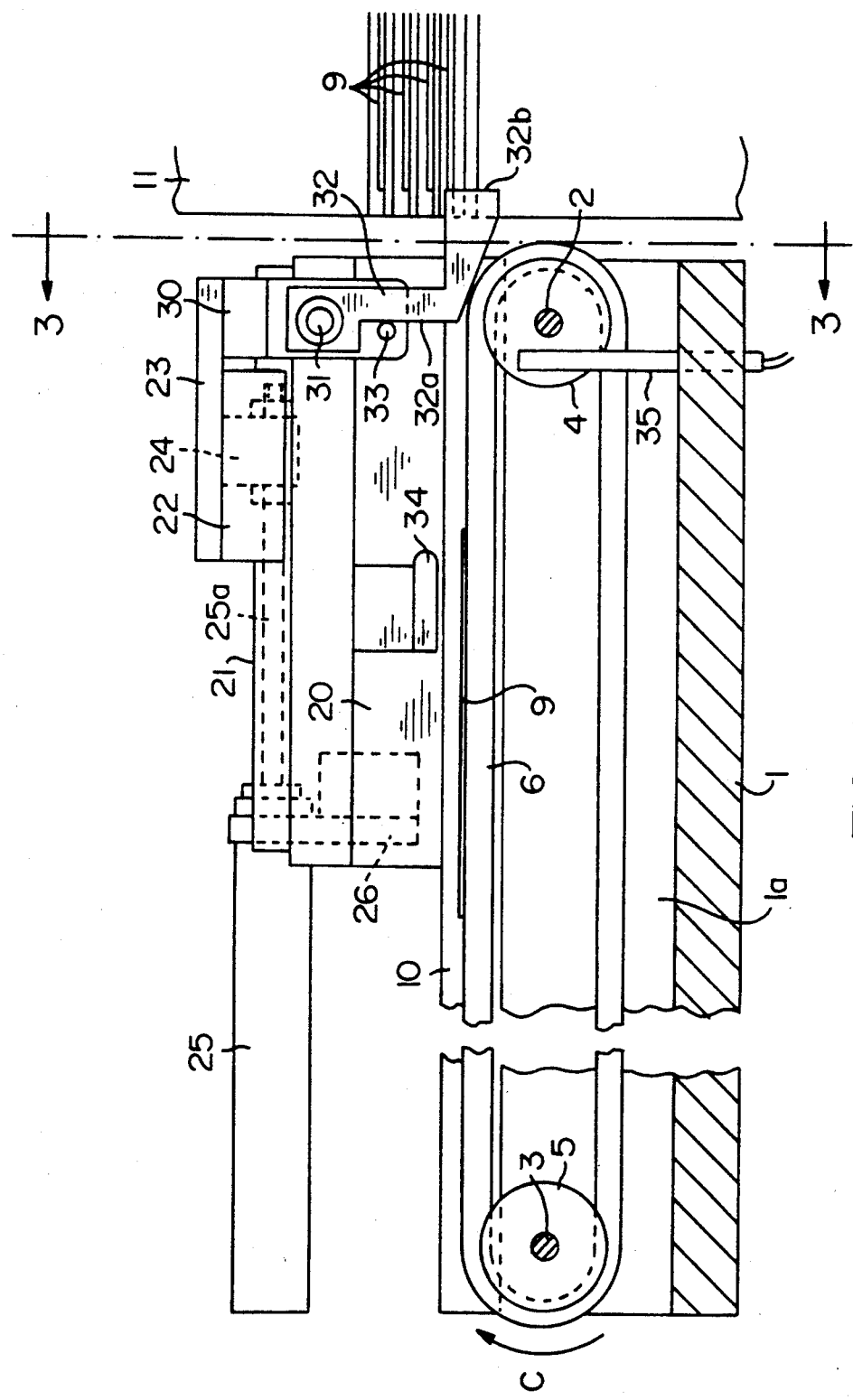
FIG. 1 illustrates one embodiment of the present invention showing the push claw advanced and pushing a lead frame into the magazine, FIG. 1 being viewed from the line 1—1 in FIG. 3.

One embodiment of the present invention will be described below with reference to FIGS. 1 through 3.

A drive shaft 2 and a driven shaft 3 are rotatably provided on side walls 1a of a base 1. Pulleys 4 and 5 are attached to the drive shaft 2 and driven shaft 3, respectively, and a pair of belt conveyors 6 is mounted between the pulleys 4 and 5.

Figure 3:
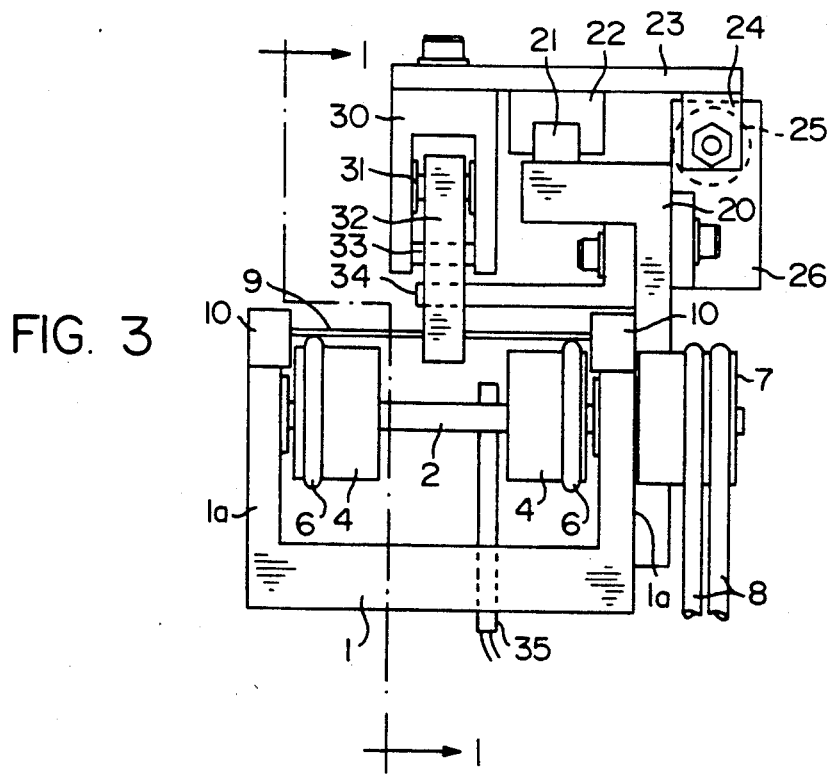
FIG. 3 is a view seen from the lines 3—3 in FIG. 1.

As seen from FIG. 3, one end of the drive shaft 2 projects to the outside of the side wall 1a, and a driven pulley 7 is attached to this projected part of the drive shaft 2. A drive belt 8 is mounted between this driven pulley 7 and a pulley fastened to the output shaft of a driving motor (not shown). Furthermore, frame guides 10 which prevent the lead frames 9 from meandering in its width direction are mounted on the upper ends of the side walls 1a of the base 1.

In front of the drive shaft 2, an unloader (or storage) magazine 11 is installed. This unloader magazine 11 is raised and lowered by means of an elevator mechanism (not shown).

A rail mount 20 which extends upward is mounted to one of the side walls (the right side wall in the embodiment as shown in FIG. 3) 1a of the base 1, and a guide rail 21 which runs parallel to the conveying direction of the lead frames 9 is fixed on this rail mount 20. A slider 22 is mounted on the guide rail 21, and a moving plate 23 is fixed to the slider 22. An air cylinder 25 is mounted to the rail mount 20 via a cylinder attachment plate 26, and the cylinder rod 25a of the air cylinder 25 0is attached to the moving plate 23 via a joint 24.

A pushing claw holder 30 is fastened to the moving plate 23. The holder 30 is straight above the belt conveyor 6. A supporting shaft 31 is rotatably mounted on this pushing claw holder 30, and a push claw 32 is fastened to the supporting shaft 31. A rotation-regulating pin 33 is fastened to the pushing claw holder 30 so that the pin 33 is beneath the supporting shaft 31.

The push claw 32 is shaped and arranged so that the back surface 32a of the push claw 32 can contact the rotation-regulating pin 33 via its own weight. When the back surface 32a of the push claw 32 is in contact with the rotation-regulating pin 33, the frame-pushing surface 32b of the push claw 32 is positioned between the pair of the belt conveyors 6.

The rail mount 20 is further provide with a stopper 34. The stopper 34 is behind the drive shaft 2 (left side of the shaft 2 in FIG. 2) and at a position corresponding to the back surface 32a of the push claw 32. Also, a sensor 35 which detects the presence and absence of a lead frame 9 is installed near the drive shaft 2 and between the pair of the belt conveyors 6.

Next, the operation of the above embodiment will be described.

Figure 2:
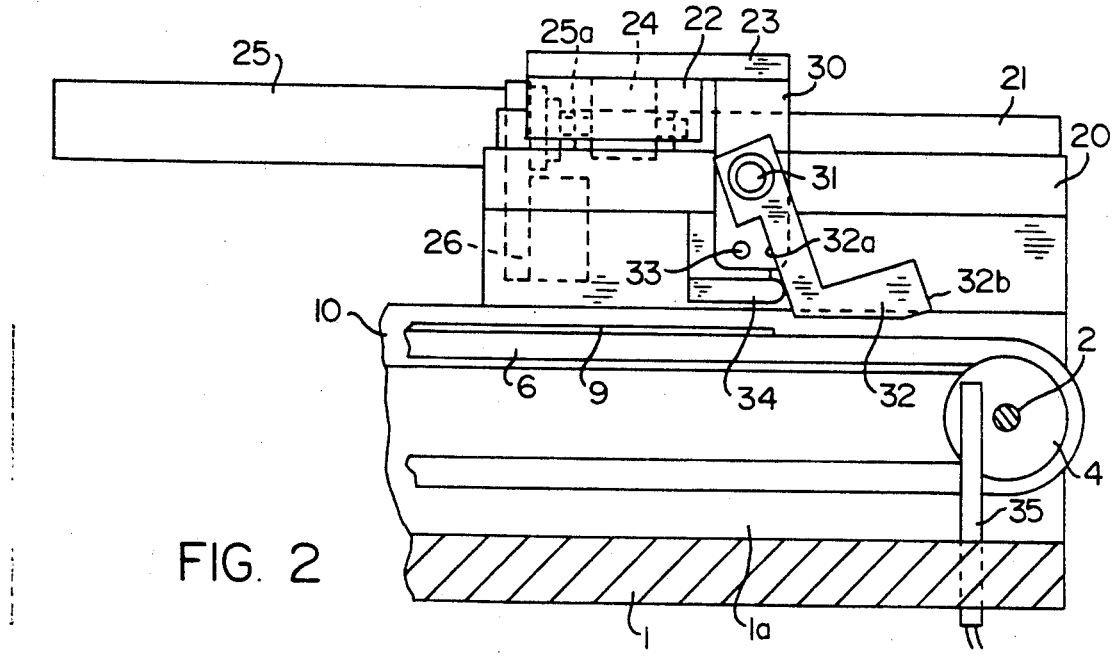
FIG. 2 shows a part of FIG. 1 particularly illustrating the claw mover retracted and the push claw raised.

When a lead frame 9 is being conveyed toward the unloader magazine 11 (or to the right in FIGS. 1 and 2) by the belt conveyors 6, the cylinder rod 25a of the air cylinder 25 remains retracted as shown in FIG. 2 so that the moving plate 23 is located away from the unloader magazine 11. In this situation, the back surface 32a of the push claw 32 is pushed by the stopper 34. Thus, the tip end of the push claw 32 is lifted, and the bottom surface of the push claw 32 is above the upper surface of the belt conveyors 6. In this state, the drive belt 8 is driven by the driving motor (not shown), so that the belt conveyors 6 are driven in the direction of arrow C via the driven pulley 7, the drive shaft 2 and the pulley 4. As a result, the lead frame 9 on the belt conveyor 6 is conveyed toward the unloader magazine 11, passes over the sensor 35 and enters into the unloader magazine 11.

When the sensor 35 detects the presence of the lead frame 9 and then the absence of the lead frame 9 as the lead frame 9 is conveyed as described above, the air cylinder 25 is actuated by the resulting detection signal, and the cylinder rod 25a is extended. As a result, the slider 22 and moving plate 23 are moved toward the unloader magazine 11, guided by the guide rail 21. When the moving plate 23 is thus moved, the pushing claw holder 30 and the supporting shaft 31 are moved together, and the supporting shaft 31 is moved away from the stopper 34. Accordingly, the push claw 32 rotates down by its own weight to come into contact with the rotation-regulating pin 33. Thus, the push claw 32 is moved toward the unloader magazine 11 maintaining the contact with the rotation-regulating pin 33. As a result, the frame-pushing surface 32b of the push claw 32 comes into contact with the trailing end of the lead frame 9 and pushes the lead frame 9 into the unloader magazine 11 as seen in FIG. 1. Afterward, the cylinder rod 25a of the air cylinder 25 is retracted as shown in FIG. 2.

Once the lead frame 9 is pushed into the unloader magazine 11 by the push claw 32, the unloader magazine 11 is raised by one pitch. By successively repeating the above described series of operations, lead frames 9 are successively put in the unloader magazine 11.

In the embodiment described above, the push claw 32 is moved by the air cylinder 25; however, it can be moved by a motor. Also, in the above embodiment, the push claw 32 contacts the rotation-regulating pin 33 via its own weight. However, a spring can be used to cause the push claw 32 to contact the rotation-regulating pin 33.

According to the present invention, after each lead frame has been brought into the magazine by a conveyor, a push claw pushes the lead frame so that it is pushed completely inside the magazine. Accordingly, lead frames are securely placed at fixed positions inside the magazine. Furthermore, since it does not need a high speed conveyor, no damage occurs to wires bonded to the lead frames. Moreover, the magazine for storing lead frames therein can be of an ordinary type, the present invention is superior in that it can be used for any type of lead frames.

I claim:

1. A lead frame pushing mechanism used in a lead frame conveying apparatus that includes a conveyor which conveys lead frames and a magazine which houses said lead frames conveyed by said conveyor, said pushing mechanism comprising:

a claw holder which is installed above an end of said conveyor, said claw holder being movable in a direction parallel to a conveying direction of said lead frames;

a driving means which drives said claw holder in a reciprocating manner after each of said lead frames has been entered into said magazine by said conveyor;

a push claw provided in said claw holder so as to be rotatable, said push claw having a frame-pushing surface;

a rotation-regulator provided in said claw holder, said regulator restricting a rotation of said push claw in a direction opposite to the conveying direction of the lead frames; and a stopper which keeps said push claw above a conveying surface of said conveyor when said claw holder moves in a direction opposite to said conveying direction of said lead frames.

* * * * *